United States Patent [19]

Wright et al.

[11] Patent Number: 5,743,961
[45] Date of Patent: Apr. 28, 1998

[54] THERMAL SPRAY COATING APPARATUS

[75] Inventors: Robert J. Wright, Tequesta; William J. Dalzell, Jr., Jupiter; George Himich, Jr., West Palm Beach; Raymond M. O'Donoghue, Coral Springs, all of Fla.

[73] Assignee: United Technologies Corporation, Hartford, Conn.

[21] Appl. No.: 647,125

[22] Filed: May 9, 1996

[51] Int. Cl.$^6$ ............................................. C23C 16/06
[52] U.S. Cl. .............. 118/620; 118/723 E; 118/723 ME; 118/723 R; 219/121.47; 219/121.48; 239/81
[58] Field of Search ...................... 118/620, 723 E, 118/723 ME, 723 MW, 723 R; 427/446, 448; 219/121.47, 121.48; 239/81; 315/111.21

[56] References Cited

U.S. PATENT DOCUMENTS

| | | | |
|---|---|---|---|
| 2,874,265 | 2/1959 | Reed et al. | 219/121 |
| 3,130,292 | 4/1964 | Gage et al. | 219/75 |
| 3,277,265 | 10/1966 | Reboux | 219/10.49 |
| 3,763,392 | 10/1973 | Hollister | 315/248 |
| 3,892,882 | 7/1975 | Guest et al. | 427/34 |
| 4,311,897 | 1/1982 | Yerushalmy | 219/121 PP |
| 4,386,258 | 5/1983 | Akashi et al. | 219/121 PM |
| 4,481,636 | 11/1984 | Curr et al. | 373/18 |
| 4,576,828 | 3/1986 | Walker, Jr. | 427/34 |
| 4,741,286 | 5/1988 | Itoh et al. | 118/620 |
| 4,801,435 | 1/1989 | Tylko | 422/186.04 |
| 4,902,870 | 2/1990 | Frind et al. | 219/121.52 |
| 4,908,492 | 3/1990 | Okamoto et al. | 219/121.52 |
| 5,144,110 | 9/1992 | Marantz et al. | 219/121.48 |
| 5,200,595 | 4/1993 | Boulos et al. | 219/121.52 |
| 5,225,656 | 7/1993 | Frind | 219/121.47 |
| 5,247,152 | 9/1993 | Blankenship | 219/121.49 |
| 5,408,066 | 4/1995 | Trapani et al. | 219/121.47 |

OTHER PUBLICATIONS

L. Bianchi, F. Blein, P. Lucchese, A. Grimaud, and P. Fauchais, "Comparison of Plasma Sprayed Alumina and Zirconia Coatings by RF and DC Plasma Spraying", 20–24 Jun. 1994, pp. 575–579, Proceedings of the 7th National Thermal Spray Conference, Boston, Massachusetts.

R. J. Wright, R. E. Anderson, Jr., and Z. R. Waltz, "Single-Crystal Alumina/Aluminum Alloy Composite Structure Fabrication by RF–Coupled Plasma Spray Processing", Sep. 1994, pp. 292–294, *Journal of Thermal Spray Technology*, vol. 3 No. 3.

R. E. Anderson, Jr., R. J. Wright, T. M. Carleton, and R. G. Panse, "Metallurgical Characteristics of As–Deposited RF–Coupled Plasma–Sprayed Aluminum Alloys", Sep. 1994, pp. 289–291, *Journal of Thermal Spray Technology*, vol. 3 No. 3.

C. M. Hackett, G. S. Settles, and J. D. Miller, "On the Gas Dynamics of HVOF Thermal Sprays", Sep. 1994, pp. 299–304, *Journal of Thermal Spray Technology*, vol. 3 No. 3.

*Primary Examiner*—Donald E. Czaja
*Assistant Examiner*—Steven B. Leavitt
*Attorney, Agent, or Firm*—Richard D. Getz

[57] ABSTRACT

A thermal spray apparatus for depositing a coating on to a substrate is provided which includes a plasma generator for selectively changing gas from a gaseous state to a plasma, and apparatus for filtering plasma. Powder particles entrained in the plasma change from a solid state to a molten state. The apparatus for filtering the plasma permits only a high intensity region of the plasma to pass through to the substrate.

3 Claims, 2 Drawing Sheets

THERMAL SPRAY COATING APPARATUS

The invention was made under a U.S. Government contract and the Government has rights herein.

BACKGROUND OF THE INVENTION

1. Technical Field

This invention applies to thermal spray coating equipment in general, and to thermal spray coating equipment having a plasma filter in particular.

2. Background Information

Thermally sprayed coatings may be applied by a variety of processes including conventional direct current (DC) plasma torches and radiofrequency (RF) plasma torches. The plasma generator of a conventional DC plasma torch generally includes a rod-like cathode located within a bore in the body portion of the torch which acts as the anode. An unreactive gas such as argon, an argon/helium mixture, or an argon/hydrogen mixture passes axially along the rod, between the rod and the body. The gas is excited into a plasma when an arc is initiated between the cathodic rod and the anodic body. The plasma extends a distance beyond the anode and cathode in what may be described as a plume. The powder to be sprayed is fed into the plasma, where ideally all of the powder changes to a molten state prior to being deposited on a substrate.

The plasma generator of an RF plasma torch generally includes a plasma confinement tube surrounded by a multiple turn induction coil connected to a RF power supply, and a powder probe extending axially within the confinement tube. Gas fed into the confinement tube passes through magnetic fields created by the RF current passing through the coils of the induction coil. The magnetic fields provide energy sufficient to change the gas from a gaseous state to a plasma. The plasma, in turn, provides energy sufficient to change powder particles introduced into the plasma from a solid state to a molten state.

One of the most significant differences between conventional DC plasma spraying and RF plasma spraying is the speed at which the gas and particles pass through and exit the gun. For example, in "Comparison of Plasma Sprayed Alumina and Zirconia Coatings by RF and DC Plasma Spraying" (Proceedings of the 7th National Thermal Spray Conference, 20–24 Jun. 1994, ASM International 1994), Bianchi et al. report that achieved velocities for fused and crushed $Al_2O_3$ particles–45+22 μm vary in the following ranges: 30–60 m/s for RF plasma torches; 150–250 m/s for conventional DC plasma torches; and 250–400 m/s for HPHV torches. A person of skill will recognize that particle velocities depend on a number of variables including particle composition and size.

RF plasma torches are often employed in thermal coating applications where relatively slow spray velocities are desirable. Low spray velocities permit the particulate matter to dwell within the plasma plume longer than is possible using conventional high velocity plasma spray apparatus. One significant advantage of a longer dwell time is that larger, less expensive powder particles can be used; e.g., the powder particle size distribution for RF plasma spraying is generally between −80 and +140 mesh as compared to the −325 mesh typically used for conventional DC plasma spraying. Another advantage of the longer dwell time is that a greater portion of powder particles introduced into the plasma change to the desirable molten state. In some cases, the increase in efficiency provided by the lower velocity can permit lower power settings to be used. A disadvantage of using an RF plasma torch, on the other hand, is that the plasma stream extending out from the gun loses energy to the relatively cool surrounding environment. The energy loss causes some molten particles to resolidify prior to deposition on the substrate. The energy loss problem is exacerbated when smaller particles are used because of their tendency to loss energy more readily.

In short, what is needed is an apparatus for plasma spraying a coating onto a substrate that efficiently deposits a high quality coating on a substrate.

DISCLOSURE OF THE INVENTION

It is, therefore, an object of the present invention to provide a thermal spray apparatus for depositing a coating onto a substrate that helps to decrease contamination within the deposited coating.

It is a further object of the present invention to provide a thermal spray apparatus for depositing a coating onto a substrate that helps to increase the density of the deposited coating.

According to the present invention, a thermal spray apparatus for depositing a coating onto a substrate is provided which includes a plasma generator for selectively changing gas from a gaseous state to a plasma, and means for filtering plasma. Powder particles entrained in the plasma change from a solid state to a molten state. The means for filtering the plasma permits only a high intensity region of the plasma to pass through to the substrate.

An advantage of the present invention is a decrease in the amount of contamination present in the deposited coating. The means for filtering the plasma permits only the high intensity region of the plasma, which contains the most dense distribution of molten particles and the highest temperatures to pass through to the substrate. As a result, less solid and only partially melted particles are captured within the deposited coating.

Another advantage of the present invention is an increase in the density of the coating being deposited onto the substrate. Reducing the number of contaminants within the coating increases the density of the coating which in most cases gives the coating greater mechanical strength.

These and other objects, features and advantages of the present invention will become apparent in light of the detailed description of the best mode embodiment thereof, as illustrated in the accompanying drawings.

BEST MODE FOR CARRYING OUT THE INVENTION

Figure 1:
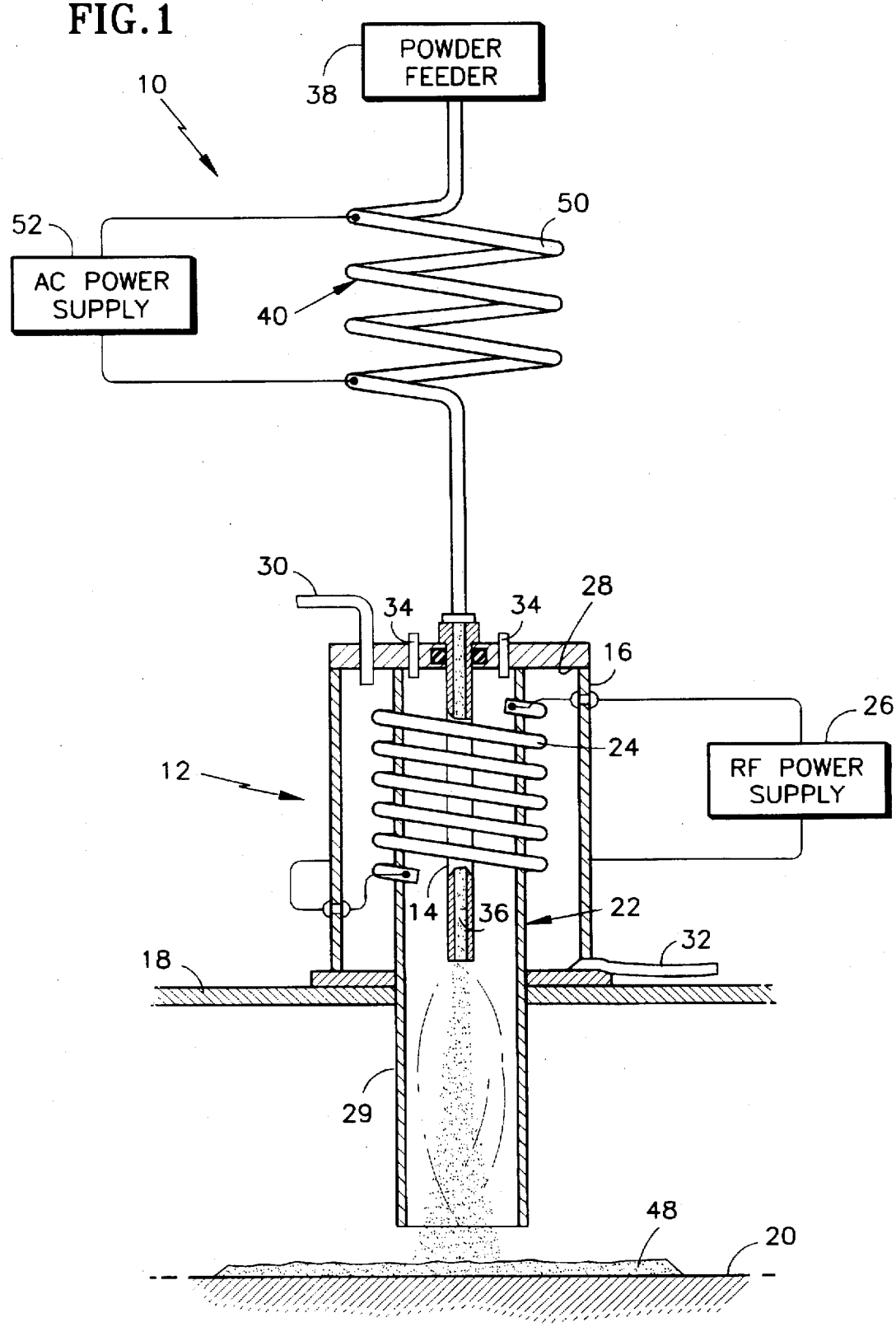
FIG. 1 is a diagrammatic view of the thermal spray apparatus including means for preheating the powder particles external to the thermal spray apparatus, and a nozzle attachment.

Referring to FIG. 1, a thermal spray apparatus 10 is shown having a plasma generator 12 and a powder probe 14 disposed within a coolant housing 16. The apparatus 10 is attached to a control vessel 18 which contains a substrate 20 to be coated. Depending upon the application, the control vessel 18 may be evacuated to a pressure lower than atmospheric.

Figure 2:
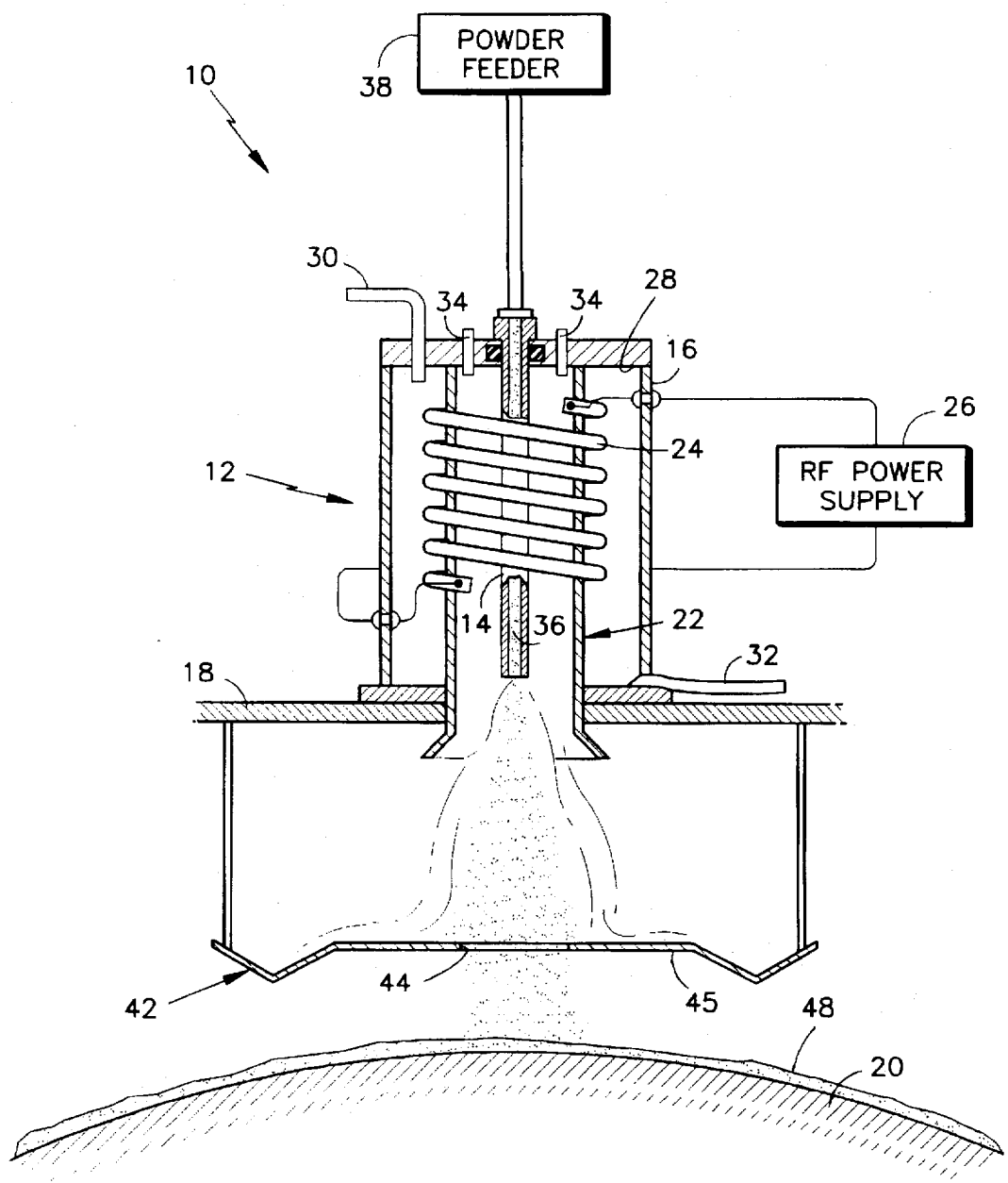
FIG. 2 is a diagrammatic view of a thermal spray apparatus including means for filtering the plasma.

The plasma generator 12 includes a confinement tube 22 and a multiple turn inductive coil 24. The inductive coil 24 is disposed around the confinement tube 22 and is electrically connected to a radiofrequency (RF) power supply 26. The RF power supply 26 provides an alternating current having an adjustable frequency and magnitude which creates a high intensity alternating magnetic fields within the confinement tube 22. In FIG. 1, the confinement tube 22 begins at the top 28 of the coolant housing 16, and includes an extension 29 which extends a distance into the control vessel 18, ending adjacent the substrate 20. The extension may also be called a nozzle. In FIG. 2, the confinement tube 22 begins at the top 28 of the coolant housing 16 and extends just inside the control vessel 18 before tapering radially outward and ending. The coolant housing 16 includes a cooling inlet 30 and outlet 32, and a plurality of plasma gas ports 34 disposed around the periphery of the powder probe 14. The plasma gas ports 34 are connected to a plasma gas source (not shown).

The powder probe 14 is cylindrically shaped and includes a center bore 36 for the passage of powder particles. The diameter of the center bore 36 is selected to accommodate the size of the powder particle being sprayed. In the preferred embodiment, the powder probe 14 consists of a ceramic such as alumina. Other insulative materials may be used alternatively including, but not limited to, refractory materials. The powder probe 14 is connected to a powder feeder 38 that can be adjusted to provide powder particles at a variety of flow rates. In the embodiment shown in FIG. 1, a heat exchanger 40 is disposed between the powder feeder 38 and the thermal spray apparatus 10.

Referring to FIG. 2, a plasma filter 42 is disposed adjacent the substrate 20 to be coated. The plasma filter 42 includes an aperture 44 disposed in a body 45. The aperture 44 is aligned with the plasma extending out from the thermal spray apparatus 10. The cross-sectional area and geometry (circular, elliptical, etc.) of the aperture 44 are chosen to allow only the high intensity region of the plasma through to the substrate 20. The high intensity region of the plasma may be defined as that region of the plasma which contains a higher average temperature and through which the flow rate of molten powder particles is greatest. The body 45 extends out around the aperture 44 sufficiently to prevent the remainder of the plasma from accessing the substrate 20. In the embodiment shown in FIG. 2, the plasma filter 42 is formed to collect the powder particles not applied.

In the operation of the thermal spray apparatus 10, the RF power supply 26 provides current which passes through the inductive coil 24. The current passing through the inductive coil 24, in turn, generates significant alternating magnetic fields within the confinement tube 22. Coolant cycled through the coolant housing 16 via the coolant inlet 30 and outlet 32 maintains the inductive coil 24 and confinement tube 22 at acceptable temperatures. A plasma generating gas that does not react with the powder including, but not limited to, argon, helium, hydrogen, or mixtures thereof, is injected into the confinement tube 22 around the periphery of the powder probe 14 via the plasma gas ports 34. The gas passes through the annulus between the powder probe 14 and the confinement tube 22 and is subjected to the magnetic fields emanating from the inductive coil 24. The alternating magnetic fields transfer energy to the gas, causing the gas to change from a gaseous state to a plasma. Powder particles and a carrier gas propelling the particles through the powder probe 14 exit the powder probe 14 and become entrained within the plasma. The plasma transfers energy to the powder particles, causing the particles to change from a solid state to a molten state. The molten particles subsequently deposit onto the substrate 20 and collectively form a coating 48.

To increase the powder deposition efficiency rate of the thermal spray apparatus 10, the present invention preheats the powder particles prior to entrainment within the plasma. In a first embodiment, the powder probe 14 provides a means for preheating the powder particles prior to entrainment within the plasma. In a second embodiment, the heat exchanger 40 disposed between the powder feeder 38 and the thermal spray apparatus 10 provides a means for preheating the powder particles prior to entrainment within the plasma. Both embodiments may be used independently or together for preheating purposes, depending upon the application and the plasma generator used.

The thermal environment within the confinement tube 22 is one of extreme temperature after a plasma has been induced. Powder particles exposed to thermal energy of that magnitude will completely or partially change state from solid to molten. A powder probe 14 consisting of a thermally conductive material such as tungsten can have powder particles changing state within its center bore 36. Molten particles within the center bore 36 are undesirable because they increase the likelihood of clogging within the bore 36. The powder probe 14 of the present invention, on the other hand, consists of a thermally insulative material such as alumina. The insulative material limits the amount of thermal energy passing through the powder probe 14 and into the powder particles. As a result, the powder particles are preheated within the powder probe 14, but not enough to change from solid state to molten state. The amount of preheating accomplished within the powder probe 14 can be adjusted by manipulating variables including, but not limited to: (1) particle dwell time within the powder probe 14, which can be varied by changing the length of the probe 14 or the speed at which the particles pass through the probe 14; (2) thermal resistivity of the powder probe 14; and (3) the geometry of the probe 14, including the wall thickness.

FIG. 1 shows the heat exchanger 40 of the second embodiment as a resistive coil 50 electrically connected to an AC power supply 52. Current passing through the resistive coil 50 causes the resistive coil 50 to dissipate thermal energy which is transferred to the powder particles passing through the resistive coil 50. Heat exchangers employing thermal energy from a source other than electrical resistance may be used alternatively. An advantage of using an external heat exchanger 40 is that energy can be imparted to the powder prior to its entering the powder probe 14 and again while the powder is within the probe 14. This is a significant advantage for coatings which include one or more materials with high melting points. Another advantage is that the thermal input of an external heat exchanger 40 can be readily tailored, or selectively used for different applications, thereby increasing the versatility of the thermal spray apparatus 10.

Confining the plasma and the entrained powder within an extension 29 of the confinement tube increases the dwell time of the powder in the plasma. As a result, more thermal energy is delivered to the powder particles. There are applications, however, where a plasma filter 42 (shown in FIG. 2) is desirable in place of a confinement tube extension 29. A person of skill will recognize that there are differences in heat magnitude and distribution of molten particles across a cross-section of the plasma. Typically, the center region of the plasma (i.e., the high intensity region) contains the most dense distribution of molten particles and the highest temperatures. Outside the center region, lower temperatures increase the percentage of particles which are either completely or partially solid and may compromise the mechanical properties of the coating 48. The plasma filter 42 permits only the center region of the plasma to pass through to the substrate 20. In addition, the plasma filter 42 is less susceptible to clogging than a confinement tube extension 29.

Although this invention has been shown and described with respect to the detailed embodiments thereof, it will be understood by those skilled in the art that various changes in form and detail thereof may be made without departing from the spirit and the scope of the invention. For example, the best mode discloses that a plasma spray filter and an external means for preheating powder particles prior to entrainment within the plasma may be used with an RF plasma generator. Alternatively, a plasma filter 42 and an external means for preheating powder particles prior to entrainment within the plasma may be used with other plasma generators including, but limited to, conventional DC arc-type apparatus.

We claim:

1. A thermal spray apparatus for depositing a coating onto a substrate, comprising:

a plasma generator, wherein said generator selectively changes gas from a gaseous state to a plasma; and means for entraining powder particles in said plasma, wherein a portion of said powder particles change into a molten state while entrained within said plasma; and a plasma filter, disposed adjacent the substrate, for filtering said powder particles entrained within said plasma;

wherein plasma and entrained powder particles exiting said plasma generator travel between said plasma generator and said plasma filter, and said plasma filter is sized to permit only a high intensity region of said plasma and entrained molten powder particles through to the substrate.

2. A thermal spray apparatus for depositing a coating onto a substrate according to claim 1, wherein said said plasma filter comprises a body with an aperture;

wherein said high intensity region of said plasma and entrained molten powder particles pass through said aperture.

3. A thermal spray apparatus for depositing a coating onto a substrate according to claim 2, wherein said body of said plasma filter is formed to collect powder particles not permitted through said aperture.

* * * * *